United States Patent [19]

Sandhu

[11] Patent Number: 5,576,071
[45] Date of Patent: Nov. 19, 1996

[54] METHOD OF REDUCING CARBON INCORPORATION INTO FILMS PRODUCED BY CHEMICAL VAPOR DEPOSITION INVOLVING ORGANIC PRECURSOR COMPOUNDS

[75] Inventor: Gurtej S. Sandhu, Boise, Id.

[73] Assignee: Micron Technology, Inc., Boise, Id.

[21] Appl. No.: 336,260

[22] Filed: Nov. 8, 1994

[51] Int. Cl.⁶ .............................. C23C 16/56; H05H 1/00
[52] U.S. Cl. ..................... 427/534; 427/533; 427/535; 427/255.1; 427/255.2; 427/255.7
[58] Field of Search ................................. 427/535, 534, 427/255.2, 255.1, 255, 533, 255.7

[56] References Cited

U.S. PATENT DOCUMENTS

| | | | |
|---|---|---|---|
| 4,558,509 | 12/1985 | Tiwari | 29/576 B |
| 4,568,565 | 2/1986 | Gupta et al. | 427/53.1 |
| 5,130,172 | 7/1992 | Hicks et al. | 427/252 |
| 5,139,825 | 8/1992 | Gordon et al. | 427/255.2 |
| 5,300,321 | 4/1994 | Nakano et al. | 427/248.1 |
| 5,320,878 | 6/1994 | Maya | 427/573 |
| 5,399,379 | 3/1995 | Sandhu | 427/255.2 |
| 5,403,620 | 4/1995 | Kaesz et al. | 427/252 |

FOREIGN PATENT DOCUMENTS 2-19468  1/1990  Japan .

OTHER PUBLICATIONS

Niemer, Burkhard et al, "Organometallic Chemical Vapor Deposition Of Tungsten Metal, And Suppression Of Carbon Incorporation By Codeposition Of Platinum", University of California, Department of Chemical Engineering, 4 Aug. 1992 (no page number).

Conrad, J. R. et al., "Ion Beam Assisted Coating And Surface Modification With Plasma Source Ion Implantation", J. Vac. Sci. Technol. A8 (4), Jul./Aug. 1990, pp. 3146–3151.

H. Watanabe et al., "Stacked Capacitor Cells for High–Density Dynamic RAM's", IED 1988, pp. 600–603.

T. Morihara et al., "Disk–Shaped Stacked Capacitor Cell For 256 Mb Dynamic Random–Access Memory", Aug. 19, 1994, Jpn. J. Appl. Phys. vol. 33 (1994), Pt. 1, No. 8, pp. 14–19.

S. Woo et al., "Selective Etching Technology of in–situ P Doped Poly–Si (SEDOP) for High Density DRAM Capacitors", 1994 Symposium on VLSI Technology of Technical Papers, pp. 25–26.

*Primary Examiner*—Roy V. King
*Attorney, Agent, or Firm*—Wells, St. John, Roberts, Gregory & Matkin P.S.

[57] ABSTRACT

A chemical vapor deposition method of providing a layer of material atop a semiconductor wafer using an organic precursor includes, a) injecting an organic precursor and a carrier gas into a reactor having a wafer positioned therein, and maintaining reactor conditions which are effective to deposit a first layer onto the wafer which incorporates carbon from the organic precursor; b) after depositing the first layer, ceasing to inject the organic precursor into the reactor and first injecting hydrogen gas into the reactor and generating a first reactive hydrogen plasma within the reactor against the first layer, the hydrogen effectively diffusing into the first layer and reacting with carbon therein to produce gaseous products which diffuse outwardly of the first layer and are expelled from the reactor; an additional reactive component can be provided; c) after the first reactive hydrogen plasma treatment, injecting the organic precursor and carrier gas to within the reactor, and maintaining the reactor at conditions which are effective to deposit a second layer onto the wafer which incorporates carbon from the organic precursor; and d) after depositing the second layer, ceasing to inject the organic precursor into the reactor and second injecting hydrogen gas into the reactor and generating a second reactive hydrogen plasma within the reactor against the second layer, the hydrogen effectively diffusing into the second layer and reacting with carbon in the second layer to produce gaseous products which diffuse outwardly of the second layer and are expelled from the reactor.

28 Claims, 1 Drawing Sheet

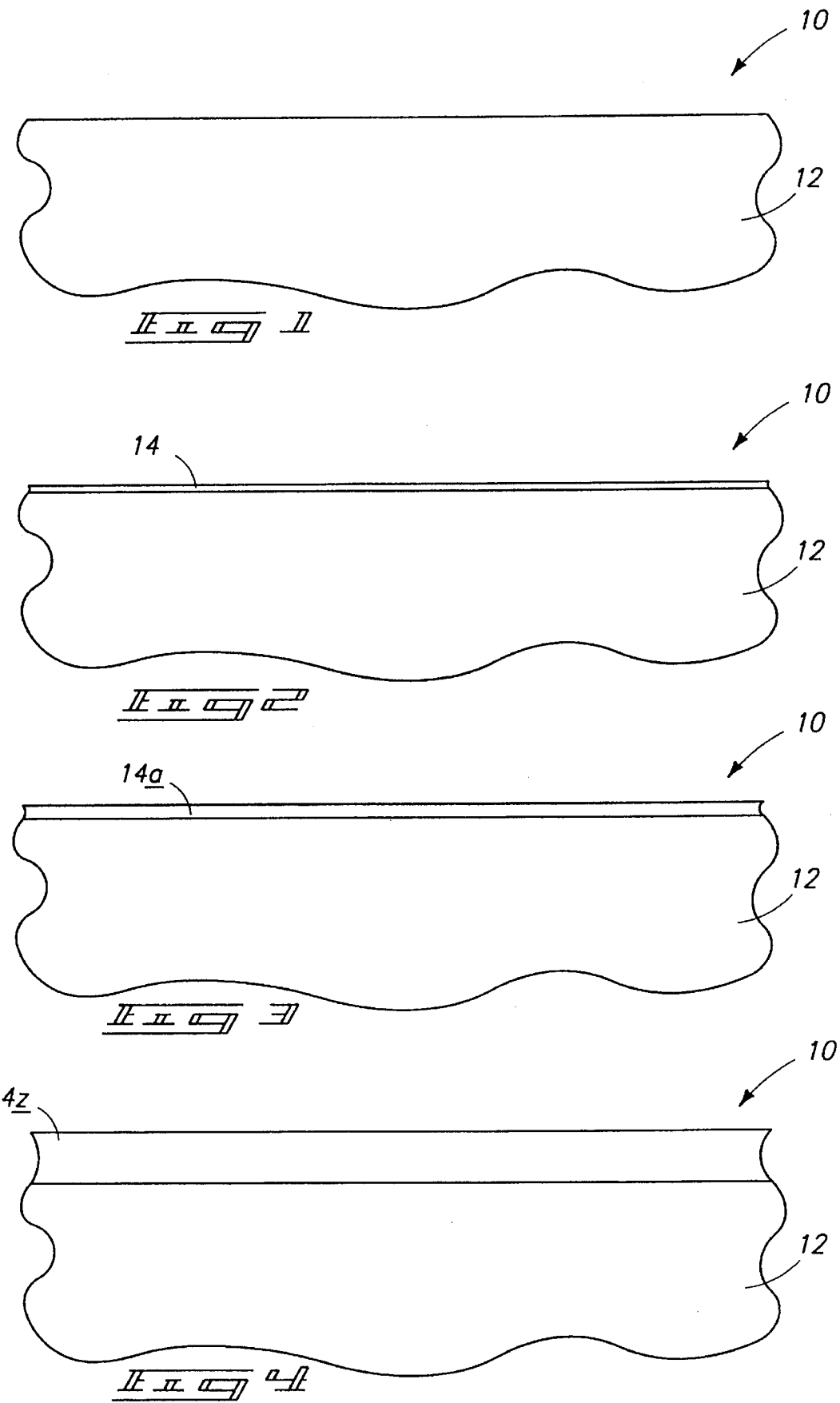

METHOD OF REDUCING CARBON INCORPORATION INTO FILMS PRODUCED BY CHEMICAL VAPOR DEPOSITION INVOLVING ORGANIC PRECURSOR COMPOUNDS

TECHNICAL FIELD

This invention relates to methods of reducing carbon incorporation into films produced by chemical vapor deposition involving organometallic precursor compounds.

BACKGROUND OF THE INVENTION

Chemical vapor deposition (CVD) is defined as the formation of a non-volatile solid films on a substrate by the reaction of vapor phase reactants that contain desired components. The gases are introduced into a reactor vessel, and decompose and react at a heated surface on the wafer to form the desired film. Chemical vapor deposition is but one process of providing thin films on semiconductor wafers, such as films of elemental metals of compounds. It is a favored deposition process in many respects, principally because of its ability to provide highly conformal layers even within deep contacts and other openings.

Organic compounds are commonly utilized as chemical vapor deposition precursors. One subclass of this group which is finding increasing use in chemical vapor deposition of metals and metal compounds are organometallic precursors. Specifically, an example is the reaction of a titanium organometallic precursor of the formula $Ti(N(CH_3)2)_4$, named tetrakisdimethyl-amidotitanium (TDMAT), and ammonia in the presence of a carrier gas which reacts to produce TiN according to the following formula:

$$Ti(NR_2)_4 + NH_3 \rightarrow TiN + \text{organic by-products}$$

Organometallic compounds contain a central or linking atom or ion (Ti in TDMAT) combined by coordinate bonds with a definite number of surrounding ligands, groups or molecules, at least one of which is organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, O, P, S, Se, and Te.

The above and other chemical vapor deposition reactions involving organometallics are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity. Additionally, it is believed that organic incorporation (specifically pure carbon or hydrocarbon incorporation) into the resultant film reduces density and resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density and poor long-term reliability.

Hydrogen is a known capable reactant with deposited carbon or metal carbides. Such will react with carbon atoms to form volatile hydrocarbons. Hydrogen atoms, radicals or ions are more reactive than molecular hydrogen in producing volatile hydrocarbons.

It would be desirable to improve upon these and other prior art chemical vapor deposition processes in producing layers having minimal incorporated carbon.

BRIEF DESCRIPTION OF THE DRAWINGS

Preferred embodiments of the invention are described below with reference to the accompanying drawings, which are briefly described below.

FIG. 1 is a diagrammatic sectional view of a semiconductor wafer at one processing step in accordance with the invention.

FIG. 2 is a view of the FIG. 1 wafer at a processing step subsequent to that shown by FIG. 1.

FIG. 3 is a view of the FIG. 1 wafer shown at a processing step subsequent to that shown by FIG. 2.

FIG. 4 is a view of the FIG. 1 wafer shown at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a chemical vapor deposition method of providing a layer of material atop a semiconductor wafer using an organic precursor comprises:

positioning a wafer within a chemical vapor deposition reactor;

injecting an organic precursor and a carrier gas to within the reactor having the wafer positioned therein, and maintaining the reactor at a temperature and a pressure which in combination are effective to deposit a first layer of material onto the wafer which incorporates carbon from the organic precursor;

after depositing the first layer, ceasing to inject the organic precursor into the reactor and first injecting hydrogen gas into the reactor and generating a first reactive hydrogen plasma within the reactor against the first layer, the hydrogen effectively diffusing into the first layer and reacting with carbon in the first layer to produce gaseous products which diffuse outwardly of the first layer and are expelled from the reactor;

after the first reactive hydrogen plasma treatment, injecting the organic precursor and carrier gas to within the reactor, and maintaining the reactor at a temperature and a pressure which in combination are effective to deposit a second layer of the material onto the wafer which incorporates carbon from the organic precursor; and after depositing the second layer, ceasing to inject the organic precursor into the reactor and second injecting hydrogen gas into the reactor and generating a second reactive hydrogen plasma within the reactor against the second layer, the hydrogen effectively diffusing into the second layer and reacting with carbon in the second layer to produce gaseous products which diffuse outwardly of the second layer and are expelled from the reactor.

In accordance with another aspect of the invention, a chemical vapor deposition method of providing a layer of material atop a semiconductor wafer using an organic precursor comprises:

positioning a wafer within a chemical vapor deposition reactor;

injecting an organic precursor and a first carrier gas to within the reactor having the wafer positioned therein, and maintaining the reactor at a temperature and a pressure which in combination are effective to deposit a first layer of material onto the wafer which incorporates carbon from the organic precursor in the form of a carbide;

after depositing the first layer, ceasing to inject the organic precursor into the reactor and first injecting hydrogen gas and a reactive carrier gas into the reactor, and generating a first reactive hydrogen plasma from the hydrogen within the reactor against the first layer, the hydrogen effectively diffusing into the first layer to react with carbon of the carbide in the first layer to produce gaseous products which diffuse outwardly of the first layer and are expelled from the reactor, the reactive carrier gas providing a non-metallic bonding component which replaces and substitutes for the carbon displaced from the carbide in the first layer;

after the first reactive hydrogen plasma treatment, injecting the organic precursor and the first carrier gas to within the reactor, and maintaining the reactor at a temperature and a pressure which in combination are effective to deposit a second layer of the material onto the wafer which incorporates carbon from the organic precursor in the form of the carbide; and after depositing the second layer, ceasing to inject the organic precursor into the reactor and second injecting hydrogen gas and the reactive carrier gas into the reactor, and generating a second reactive hydrogen plasma from the hydrogen within the reactor against the second layer, the hydrogen effectively diffusing into the second layer to react with carbon of the carbide in the second layer to produce gaseous products which diffuse outwardly of the second layer and are expelled from the reactor, the reactive gas providing a non-metallic bonding component which replaces and substitutes for the carbon displaced from the carbide in the second layer.

More particularly and with reference to the figures, a semiconductor wafer is indicated generally by reference numeral 10, and comprises a bulk substrate 12. Such would be positioned within a chemical vapor deposition reactor for processing in accordance with the invention. An organic precursor and a carrier gas would be injected to within the reactor, and the reactor maintained at temperature and pressure conditions which, in combination, are effective to deposit a thin first layer 14 (FIG. 2) of material onto the wafer. Undesirably, carbon from the organic precursor will be incorporated into the deposited first layer.

As an example where the deposited layer is desired to be TiN, one type of precursor would be organometallic precursors such as TDMAT. An example reactive and carrier gas would be $N_2$. For titanium nitride, the preferred pressure is from 0.1 Torr to 10 Torr. The preferred temperature is 200° C. to 700° C. A specific reduction to practice example temperature and pressure were a wafer carrier temperature of 420° C., and a reactor pressure at 0.5 Torr. Titanium from the organometallic precursor is intended to combine with the nitrogen to deposit a TiN layer. Undesirably, some of the carbon from the organic precursor combines with the titanium to form TiC, as opposed to the desired TiN. While the resultant film will still predominantly comprise TiN, 20 molar percent or greater TiC can be formed within the film. Further and even more undesirable, hydrocarbon products from the precursor typically become incorporated in the film, further adversely affecting conductivity.

In accordance with the invention, deposited first layer 14 is very thin at less than 50 Angstroms. For TiN, a preferred thickness range is from a single atomic thick layer to 40 Angstroms, with about 15 Angstroms being most preferred.

After depositing first layer 14, injection of the organic precursor is ceased, and a first injection of hydrogen gas into the reactor is conducted. Preferably, a time lag is provided between the injection of the organic precursor and the injection of the hydrogen, with an example and preferred time lag period being 5 seconds. Where the desired deposited layer is to be a compound such as TiN as opposed to an elemental or alloy metal layer such as Ti, a reactive carrier gas is preferably also injected into the reactor with the hydrogen. A typical and preferred volumetric ratio is at least 2:1 $H_2$ to reactive carrier gas. Within the reactor, a first reactive hydrogen plasma is generated from hydrogen within the reactor which causes hydrogen atom bombardment against first layer 14. An example and preferred reactive gas in accordance with this description is $N_2$. The hydrogen will effectively diffuse into first layer 14 to react with carbon of the carbide to produce gaseous products (typically hydrocarbons) which diffuse outwardly of the first layer and are expelled from the reactor. The reactive carrier gas provides a bonding component (atomic N) which replaces and substitutes for the carbon displaced from the carbide in the first layer to transform TiC to TiN. In this example, atomic N functions as a non-metallic bonding component to the metallic Ti, and results in conductive TiN. As another alternative, the reactive gas and hydrogen gas might comprise the same gas, such as $NH_3$.

Where the desired deposited layer is to be elemental Ti, for example, layer 14 would be deposited utilizing a reaction inert carrier gas, such as Ar. Hydrogen would likewise be fed to the reactor for the plasma bombardment treatment utilizing an inert carrier gas such as Ar. An example RF power range for hydrogen plasma treatment is from 50 to 1,000 W.

Preferably, the time treatment for hydrogen plasma bombardment is significantly greater (i.e., at least 5 times greater) than the time period for the deposition to produce layer 14. Also, the deposition to produce layer 14 could be conducted with or without plasma enhancement, while the hydrogen ion bombardment of the first reactive hydrogen treatment will always involve plasma.

After the first reactive hydrogen plasma treatment, the organic precursor and first carrier gas are again injected to within the reactor which is again maintained at a temperature and pressure which in combination are effective to deposit a subsequent second layer atop layer 14. Again, the outer layer will incorporate carbon from the organic precursor, and in the described example typically in the form of a carbide. FIG. 3 illustrates layer 14 having grown to be twice its thickness as layer 14a, with the outer portion of layer 14a constituting the second deposited layer. Carbon will be largely concentrated in this outer region, having been previously removed from the underlying layer 14.

After deposition of this second layer, injection of the organic precursor is ceased, and a second injecting of hydrogen gas and the reactive carrier gas into the reactor is conducted. A second reactive hydrogen plasma from the hydrogen gas within the reactor is generated to cause hydrogen to bombard against the second layer. Such hydrogen will effectively diffuse into the outer portions of the layer to react with carbon of the carbide in the second layer, as well as entrained hydrocarbons, to produce gaseous products which diffuse outwardly of the second layer and are expelled from the reactor. Such second hydrogen plasma treatment is preferably essentially identical to the first, and conducted at a considerably greater time than the time period for the deposition of the second layer. Further preferably, a time lag is provided between injection of the organic precursor and injection of the hydrogen gas and reactive carrier gas, with an example preferred time period being 5 seconds.

Referring to FIG. 4, the alternating deposition and treatment sequences are continued until a desired thickness layer 14z is produced. Accordingly, deposition is pulsed with intervening hydrogen plasma treatment. Typically and most preferably, the sum of the plasma treatment steps time periods will be at least five times the sum of the organic precursor injection steps time periods to facilitate carbon removal from the desired deposited layer. Time for plasma treatments will be impacted by density and permeability of hydrogen into the deposited films.

Below is a table illustrating a deposition in accordance with the invention including the various conditions.

| $H_2$ PLASMA TREATMENT | DEPOSITION | PLASMA |
| --- | --- | --- |
| Electrode Spacing | 400 mils | 150 mils |
| Pressure | 0.450 Torr | 2.00 Torr |
| Temperature | 420° C. | 420° C. |
| RF Wattage | 0 | 625 W |
| $N_2$ | 100 sccm | 100 sccm |
| $H_2$ | 0 | 220 sccm |
| Helium through TDMAT | 40 sccm | 0 |
| Time | 2 sec | 20 sec |
| Purge | 200 sccm | 0 |

The above treatment conditions were repeated 10 times, such that 10 separate deposited TiN layers were provided. The final deposition thickness of the TiN layer in accordance with the reduction-to-practice example was 92 Angstroms. This was compared to a control TiN layer of 88 Angstroms thickness which was deposited in a single step.

Atomic carbon percent in the control sample was 18%, while that in accordance with the invention was 4%, which is a greater than four times lowering of carbon incorporation. The control sample also had oxide, while the inventive sample had only 3% percent oxide. The resultant resistance in ohms/cm$^2$ was 2.09×10$^6$ for the control, and 526 ohms/cm$^2$ for the invention example. Oxide formation is a result of exposure of the wafer to ambient room conditions, and was produced by exposing both wafers to ambient room conditions for 24 hours. The invention example exhibited considerably lower oxide formation due to a greater density film being inherently produced.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of minimizing hydrocarbon incorporation in a layer of material provided atop a wafer by chemical vapor deposition using an organic precursor, the method comprising the following steps:

positioning a wafer within a chemical vapor deposition reactor;

injecting an organic precursor to within the reactor having the wafer positioned therein, and maintaining the reactor at a temperature and a pressure which in combination are effective to deposit a first layer of material onto the wafer which incorporates carbon from the organic precursor in the form of hydrocarbons;

after depositing the first layer, ceasing to inject the organic precursor into the reactor and first injecting hydrogen gas into the reactor and generating a first reactive hydrogen plasma within the reactor against the first layer, the hydrogen effectively diffusing into the first layer and reacting with hydrocarbons in the first layer to produce gaseous products which diffuse outwardly of the first layer and are expelled from the reactor;

after the first reactive hydrogen plasma treatment, injecting the organic precursor and carrier gas to within the reactor, and maintaining the reactor at a temperature and a pressure which in combination are effective to deposit a second layer of the material onto the wafer which incorporates carbon from the organic precursor; and after depositing the second layer, ceasing to inject the organic precursor into the reactor and second injecting hydrogen gas into the reactor and generating a second reactive hydrogen plasma within the reactor against the second layer, the hydrogen effectively diffusing into the second layer and reacting with carbon in the second layer to produce gaseous products which diffuse outwardly of the second layer and are expelled from the reactor.

2. The chemical vapor deposition method of claim 1 wherein the organic precursor is an organometallic precursor.

3. The chemical vapor deposition method of claim 1 wherein each of the first and second layers are deposited to respective thicknesses of less than 50 Angstroms.

4. The chemical vapor deposition method of claim 1 wherein the organic precursor injection steps and the reactive plasma treatment steps are conducted for respective time periods, the sum of the plasma treatment step's time periods being at least five times as great as the sum of the organic precursor injection step's time periods.

5. The chemical vapor deposition method of claim 1 further comprising providing a time lag between each of the injecting of the organic precursor steps and injecting of the hydrogen gas steps.

6. The chemical vapor deposition method of claim 1 wherein the organic precursor injection steps and the reactive plasma treatment steps are conducted for respective time periods, the sum of the plasma treatment step's time periods being at least five times as great as the sum of the organic precursor injection step's time periods; and further comprising:

providing a time lag between each of the injecting of the organic precursor steps and injecting of the hydrogen gas steps.

7. The chemical vapor deposition method of claim 1 wherein each of the first and second layers are deposited to respective thicknesses of less than 50 Angstroms, and further comprising providing a time lag between each of the injecting of the organic precursor steps and injecting of the hydrogen gas steps.

8. The chemical vapor deposition method of claim 1 wherein, the organic precursor is an organometallic precursor;

each of the first and second layers are deposited to respective thicknesses of less than 50 Angstroms;

the organic precursor injection steps and the reactive plasma treatment steps are conducted for respective time periods, the sum of the plasma treatment step's time periods being at least five times as great as the sum of the organic precursor injection step's time periods; and further comprising:

providing a time lag between each of the injecting of the organic precursor steps and injecting of the hydrogen gas steps.

9. The chemical vapor deposition method of claim 1 wherein the organic precursor comprises tetrakisdimethylamido titanium and the deposited material of the first and second layers predominantly comprises TiN.

10. The chemical vapor deposition method of claim 1 wherein each of the first and second layer depositions are conducted without plasma enhancement.

11. The chemical vapor deposition method of claim 1 wherein each of the first and second layer depositions are conducted with plasma enhancement.

12. A chemical vapor deposition method of providing a layer of metal nitride material atop a semiconductor wafer using an organic precursor, the method comprising the following steps:

positioning a wafer within a chemical vapor deposition reactor;

injecting an organic precursor and a carrier gas to within the reactor having the wafer positioned therein, and maintaining the reactor at a temperature and a pressure which in combination are effective to deposit a first layer of material onto the wafer which incorporates carbon from the organic precursor in the form of a carbide;

after depositing the first layer, ceasing to inject the organic precursor into the reactor and first injecting hydrogen gas and a reactive gas into the reactor, and generating a first reactive hydrogen plasma from the hydrogen within the reactor against the first layer, the hydrogen effectively diffusing into the first layer to react with carbon of the carbide in the first layer to produce gaseous products which diffuse outwardly of the first layer and are expelled from the reactor, the reactive gas providing a non-metallic bonding component which replaces and substitutes for the carbon displaced from the carbide in the first layer;

after the first reactive hydrogen plasma treatment, injecting the organic precursor and the first carrier gas to within the reactor, and maintaining the reactor at a temperature and a pressure which in combination are effective to deposit a second layer of the material onto the wafer which incorporates carbon from the organic precursor in the form of the carbide; and after depositing the second layer, ceasing to inject the organic precursor into the reactor and second injecting hydrogen gas and the reactive gas into the reactor, and generating a second reactive hydrogen plasma from the hydrogen within the reactor against the second layer, the hydrogen effectively diffusing into the second layer to react with carbon of the carbide in the second layer to produce gaseous products which diffuse outwardly of the second layer and are expelled from the reactor, the reactive gas providing a non-metallic bonding component which replaces and substitutes for the carbon displaced from the carbide in the second layer.

13. The chemical vapor deposition method of claim 12 wherein the organic precursor is an organometallic precursor.

14. The chemical vapor deposition method of claim 12 wherein each of the first and second layers are deposited to respective thicknesses of less than 50 Angstroms.

15. The chemical vapor deposition method of claim 12 wherein the organic precursor injection steps and the reactive plasma treatment steps are conducted for respective time periods, the sum of the plasma treatment step's time periods being at least five times as great as the sum of the organic precursor injection step's time periods.

16. The chemical vapor deposition method of claim 12 further comprising providing a time lag between each of the, a) injecting of the organic precursor steps, and b) injecting of the hydrogen gas and reactive gas steps.

17. The chemical vapor deposition method of claim 12 wherein the organic precursor injection steps and the reactive plasma treatment steps are conducted for respective time periods, the sum of the plasma treatment step's time periods being at least five times as great as the sum of the organic precursor injection step's time periods, and further comprising:

providing a time lag between each of the, a) injecting of the organic precursor steps, and b) injecting of the hydrogen gas and reactive gas steps.

18. The chemical vapor deposition method of claim 12 wherein each of the first and second layers are deposited to respective thicknesses of less than 50 Angstroms, and further comprising providing a time lag between each of the, a) injecting of the organic precursor steps, and b) injecting of the hydrogen gas and reactive steps.

19. The chemical vapor deposition method of claim 12 wherein, the organic precursor is an organometallic precursor;

each of the first and second layers are deposited to respective thicknesses of less than 50 Angstroms;

the organic precursor injection steps and the reactive plasma treatment steps are conducted for respective time periods, the sum of the plasma treatment step's time periods being at least five times as great as the sum of the organic precursor injection step's time periods; and further comprising:

providing a time lag between each of the, a) injecting of the organic precursor steps, and b) injecting of the hydrogen gas steps.

20. The chemical vapor deposition method of claim 12 wherein each of the first and second layer depositions are conducted without plasma enhancement.

21. The chemical vapor deposition method of claim 12 wherein each of the first and second layer depositions are conducted with plasma enhancement.

22. The chemical vapor deposition method of claim 12 wherein the reactive gas and the hydrogen gas are provided to the reactor at a volumetric ratio of at least 2:1 respectively.

23. The chemical vapor deposition method of claim 12 wherein the reactive gas and hydrogen gas comprise the same gas.

24. The chemical vapor deposition method of claim 12 wherein the reactive gas and hydrogen gas comprise the same gas, namely $NH_3$.

25. The chemical vapor deposition method of claim 12 wherein the organic precursor comprises tetrakisdimethylamido titanium, the reactive gas comprises $N_2$ and the deposited material of the first and second layers predominantly comprises TiN.

26. The chemical vapor deposition method of claim 12 wherein the organic precursor comprises tetrakisdimethylamido titanium and the reactive gas comprises $N_2$, the $N_2$ and tetrakisdimethylamido titanium being provided to the reactor at a volumetric ratio of at least 2:1 respectively, and the deposited material of the first and second layers predominantly comprising TiN.

27. A method of minimizing hydrocarbon incorporation in a layer of material provided atop a wafer by chemical vapor deposition using an organic precursor, the method comprising the following steps:

positioning a wafer within a chemical vapor deposition reactor;

injecting an organic precursor to within the reactor having the wafer positioned therein, and maintaining the reactor at a temperature and a pressure which in combination are effective to deposit a first layer of material onto the wafer which incorporates carbon from the organic precursor in the form of hydrocarbons; and after depositing the first layer, ceasing to inject the organic precursor into the reactor and injecting hydrogen gas into the reactor and generating a reactive hydrogen plasma within the reactor against the first layer, the hydrogen effectively diffusing into the first layer and reacting with hydrocarbons in the first layer to produce gaseous products which diffuse outwardly of the first layer and are expelled from the reactor.

28. A chemical vapor deposition method of providing a layer of metal nitride material atop a semiconductor wafer using an organic precursor, the method comprising the following steps:

positioning a wafer within a chemical vapor deposition reactor;

injecting an organic precursor and a carrier gas to within the reactor having the wafer positioned therein, and maintaining the reactor at a temperature and a pressure which in combination are effective to deposit a first layer of material onto the wafer which incorporates carbon from the organic precursor in the form of a carbide; and after depositing the first layer, ceasing to inject the organic precursor into the reactor and injecting hydrogen gas and a reactive gas into the reactor, and generating a reactive hydrogen plasma from the hydrogen within the reactor against the first layer, the hydrogen effectively diffusing into the first layer to react with carbon of the carbide in the first layer to produce gaseous products which diffuse outwardly of the first layer and are expelled from the reactor, the reactive gas providing a non-metallic bonding component which replaces and substitutes for the carbon displaced from the carbide in the first layer.

* * * * *